US011774861B2

(12) United States Patent
Brouwer et al.

(10) Patent No.: US 11,774,861 B2

(45) Date of Patent: Oct. 3, 2023

(54) CALIBRATION METHOD FOR A LITHOGRAPHIC SYSTEM

(71) Applicant: ASML Netherlands B.V., Veldhoven (NL)

(72) Inventors: Cornelis Melchior Brouwer, Veldhoven (NL); Chung-Hsun Li, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/775,802

(22) PCT Filed: Oct. 12, 2020

(86) PCT No.: PCT/EP2020/078543

§ 371 (c)(1),
(2) Date: May 10, 2022

(87) PCT Pub. No.: WO2021/094041

PCT Pub. Date: May 20, 2021

(65) Prior Publication Data

US 2022/0390855 A1 Dec. 8, 2022

(30) Foreign Application Priority Data

Nov. 11, 2019 (EP) .................................... 19208249

(51) Int. Cl.

*G03F 7/20* (2006.01)
*G03F 7/00* (2006.01)

(52) U.S. Cl.

CPC ...... *G03F 7/70516* (2013.01); *G03F 7/70491* (2013.01)

(58) Field of Classification Search

CPC . H01L 21/0274; G03F 7/705; G03F 7/70633; G03F 9/7019; G03F 7/70516; G03F 7/70491; G03F 7/70775

See application file for complete search history.

(56) References Cited

U.S. PATENT DOCUMENTS 6,867,166 B2 3/2005 Yang et al.
6,961,116 B2 11/2005 Den Boef et al.

(Continued)

FOREIGN PATENT DOCUMENTS

EP 2 131 243 A2 12/2009
NL 2009827 A 6/2013

(Continued)

OTHER PUBLICATIONS

International Search Report and Written Opinion of the International Searching Authority directed to related International Patent Application No. PCT/EP2020/078543, dated Feb. 5, 2021; 10 pages.

(Continued)

*Primary Examiner* — Mesfin T Asfaw

(74) *Attorney, Agent, or Firm* — Sterne, Kessler, Goldstein & Fox P.L.L.C.

(57) ABSTRACT

Disclosed is a method of determining calibrated reference exposure and measure grids for referencing position of a substrate stage in a lithographic system. The method comprises obtaining calibration data relating to one or more calibration substrates; and determining an exposure grid for an exposure side of the lithographic system from said calibration data and a measure grid for a measure side of the lithographic system from said calibration data. The exposure grid and said measure grid are decomposed so as to remove a calibration substrate dependent component from said exposure grid and from said measure grid to obtain a (Continued)

substrate independent exposure grid and substrate independent measure grid.

16 Claims, 3 Drawing Sheets

(56) References Cited

U.S. PATENT DOCUMENTS

2006/0033921 A1 2/2006 Den Boef et al.
2006/0066855 A1 3/2006 Boef et al.
2009/0153817 A1 6/2009 Kawakubo
2009/0195768 A1 8/2009 Bijnen et al.
2010/0201963 A1 8/2010 Cramer et al.
2011/0027704 A1 2/2011 Cramer et al.
2011/0043791 A1 2/2011 Smilde et al.
2011/0096315 A1 4/2011 Arrizabalaga Uriarte
2011/0102753 A1 5/2011 Van De Kerkhof et al.
2011/0213584 A1* 9/2011 Menchtchikov .... G03F 7/70516 702/150
2012/0044470 A1 2/2012 Smilde et al.
2012/0123581 A1 5/2012 Smilde et al.
2013/0258310 A1 10/2013 Smilde et al.
2013/0271740 A1 10/2013 Quintanilha
2014/0168620 A1 6/2014 Schmitt-Weaver et al.
2015/0261097 A1 9/2015 Mathijssen et al.
2015/0355554 A1 12/2015 Mathijssen
2017/0160647 A1 6/2017 Baselmans et al.
2019/0094721 A1 3/2019 Tinnemans et al.

FOREIGN PATENT DOCUMENTS

WO WO 2009/078708 A1 6/2009
WO WO 2009/106279 A1 9/2009
WO WO 2013/178422 A1 12/2013
WO WO 2015/051970 A1 4/2015
WO WO 2018/114152 A1 6/2018
WO WO 2020/057900 A1 3/2020

OTHER PUBLICATIONS

"Calibration of Exposure Grid Deformation," Research Disclosure, Kenneth Mason, vol. 519, No. 3, Jul. 1, 2007; 4 pages.

* cited by examiner

CALIBRATION METHOD FOR A LITHOGRAPHIC SYSTEM

CROSS-REFERENCE TO RELATED APPLICATIONS

This application claims priority of EP application 19208249.3 which was filed on Nov. 11, 2019 and which is incorporated herein in its entirety by reference.

BACKGROUND

Field of the Invention

The present invention relates to methods and apparatus usable, for example, in the manufacture of devices by lithographic techniques, and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as “fields”.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

It is known to use position measurement systems for measuring positions of the stages (such as a substrate stage or mask stage) in the lithographic apparatus (or scanner, the two terms will be used interchangeably throughout). For example, it has been proposed to make use of an encoder measurement system. Thereto, an (e.g. two dimensional) encoder grid is applied which may be connected to a reference structure of the lithographic apparatus, while encoder sensor heads are connected to the stage so as to follow its position relative to the grid.

In order to calibrate the position measurement system, a plurality of calibrations is performed at present. In the case of the encoder measurement system, grid errors are for example calibrated by using data measured by the encoder system while moving the stage. Also a calibration wafer may be used.

Present calibration methods have a number of drawbacks. In particular they take up too much time. For example in the case of the encoder measurement system, a complete grid calibration may take several hours or even days. This leads to unacceptable long-downs of the lithographic apparatus each time the grid needs to be (re)calibrated and each time a grid verification test is needed to assess the validity of the grid calibration. Furthermore the present approach does not take into account clamping deformation of the wafer. As a result, some mid-frequency clamping errors, which are not calibrated, can survive, reducing the overlay performance of the apparatus.

SUMMARY OF THE INVENTION

The invention in a first aspect provides a method of determining calibrated reference exposure and measure grids for referencing position of a substrate stage in a lithographic system, comprising: obtaining calibration data relating to one or more calibration substrates; determining an exposure grid for an exposure side of the lithographic system from said calibration data; determining a measure grid for a measure side of the lithographic system from said calibration data; and decomposing said exposure grid and said measure grid so as to remove a calibration substrate dependent component from said exposure grid and from said measure grid to obtain a substrate independent exposure grid and substrate independent measure grid.

Also disclosed is a computer program, processing system and lithographic system being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
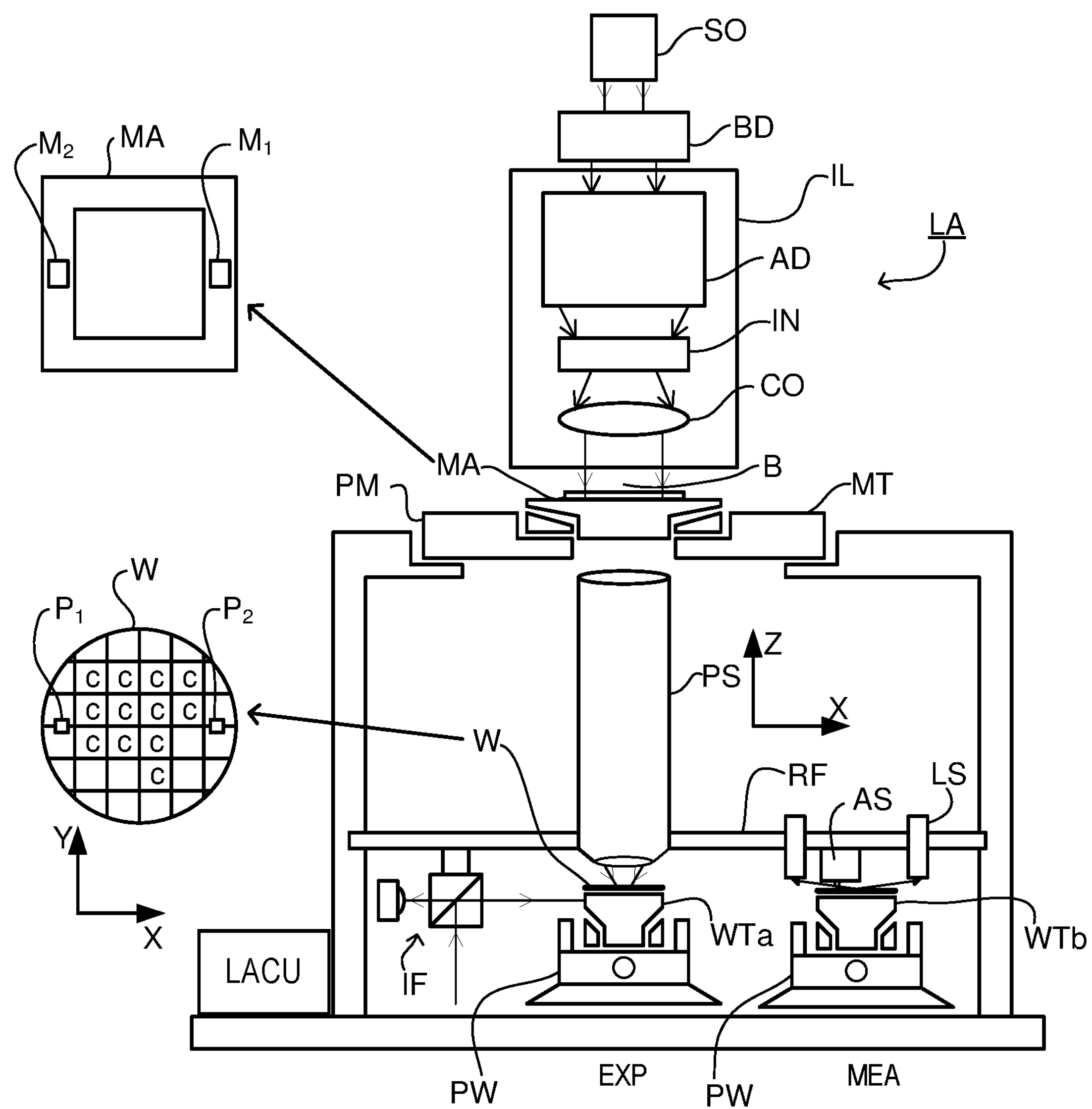
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called “maskless” lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
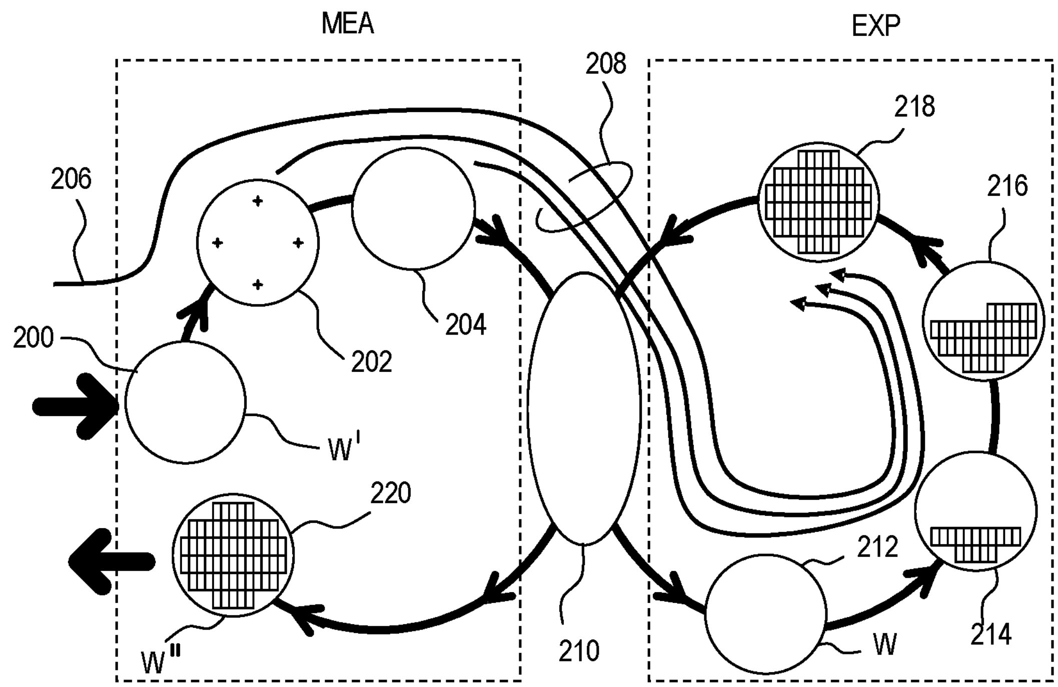
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a ‘dry’ tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a “wafer grid”, which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the ‘ideal’ grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
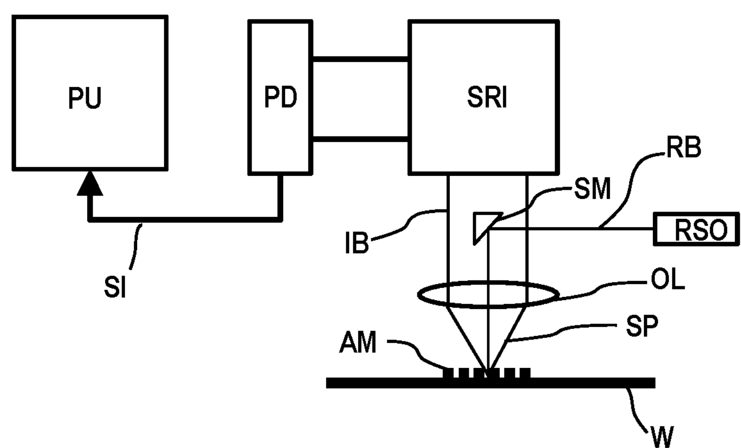
FIG. 3 is a schematic illustration of an alignment sensor adaptable according to an embodiment of the invention.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided.

Figure 4:
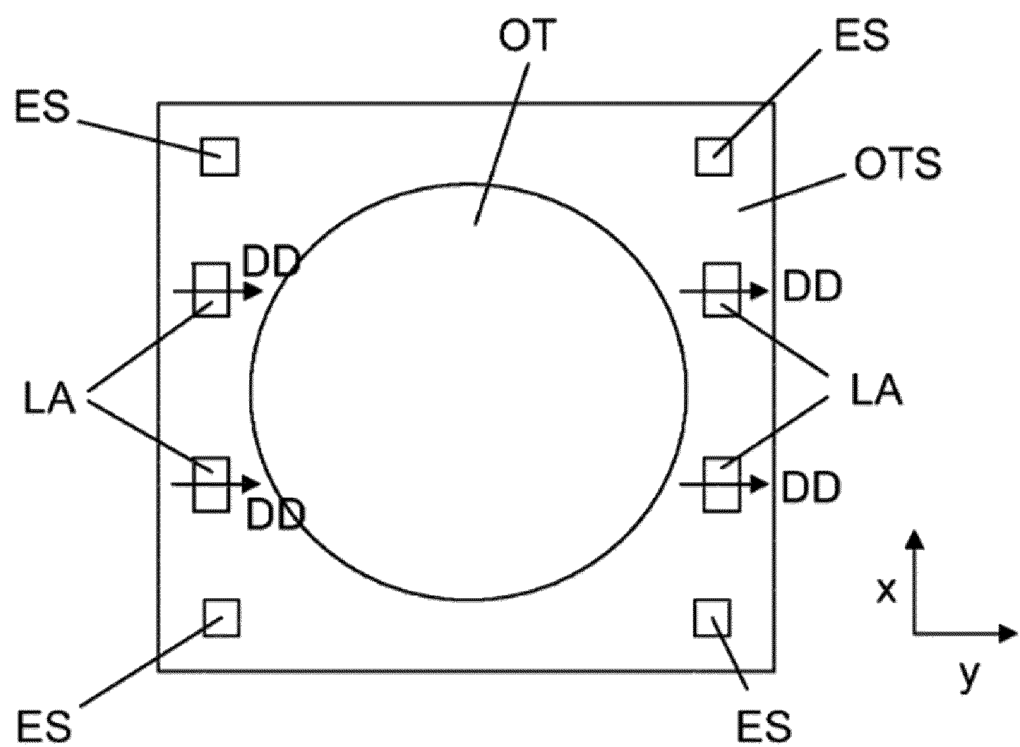
FIG. 4 depicts a top view of an actuator arrangement in a stage system comprising an encoder block.

FIG. 4 depicts a movable substrate stage system of a lithographic apparatus comprising a substrate table depicted as object table OT and an encoder block, depicted as object table support OTS. The object table support OTS comprises an object table support surface, for example an encoder block pot hole, configured to support the object table OT. The object table support surface extends in the x-y plane.

The object table support OTS comprises a number of encoder sensors ES to measure a position of the OTS with respect to one or more grid plates mounted on a reference element, for example a reference frame. The encoder sensors ES shown in FIG. 4 may be configured to measure the position of the object table support OTS in six degrees of freedom.

The object table OT may be clamped with a vacuum clamp or electrostatic on the object table support surface.

The substrate table support OTS comprises a number of Lorentz actuators LA, each being configured to drive the substrate table support OTS and therewith the substrate table OS in a driving direction DD. In FIG. 4, only Lorentz actuators for driving in a first driving direction DD, the y-direction, are shown. In substrate stage systems for a lithographic apparatus, usually further actuators will be provided to move the object table support OTS in the x-direction and the z-direction such that positioning of the object table support is possible in six degrees of freedom.

The top view of FIG. 4 can be regarded as a projection on a plane parallel to the object table support surface, since the object table support surface extends in the x-y plane.

Such an encoder measurement system may include an encoder grid which is connected to a reference structure of the lithographic apparatus, while encoder sensors are connected to a moving stage of the apparatus, such as the moving substrate table WT thereof. Thus the encoder heads are able to follow the position of the substrate table WT relative to the encoder grid during projection of a pattern at a target position onto the substrate. As a consequence, inaccuracies, errors and other kinds of deviations in parts of the position measurement system, such as the encoder grid of the encoder measurement system, may translate into deviations, like overlay errors, of the pattern as created on the substrate W during the projection step. The pattern on the substrate W may subsequently be measured in a measurement step, in which the pattern is for example read out by an alignment sensor of the lithographic apparatus. The output signal of the alignment sensor then provides a signal corresponding to measured lines and/or dots of the pattern, and thus may provide information about any deviations in these lines and/or dots of the pattern. A first important cause of these deviations are the above mentioned deviations in the position measurement system during the projection step. A second important cause of these deviations are deviations in the position measurement system during the measurement step. Calibration of the position measurement system(s) for these deviations can be performed using the measurement results like the alignment sensor output signals.

An embodiment of a calibration method shall be described for calibrating a position measurement system (such as an encoder type) for the calibration of the substrate table WT. This method starts with a projection procedure in which patterns are exposed onto the substrate W at various positions. Since the projection procedure is performed by each time positioning the substrate W relative to an expose grid of the measurement system, deviations in this expose grid are automatically copied together with the pattern onto the substrate W. Subsequently the calibration method includes the act of performing a measurement in which the projected pattern is read out. With this the position of the pattern on the substrate W is measured relative to a measure grid. Deviations in this measure grid are thus automatically included in the measurement results.

It is noted that the expose grid and measure grid in this example are two different grids since the substrate W is measured at another part of the lithographic apparatus than where the projection of the pattern onto the substrate W has taken place. For example, the projecting of the pattern on the substrate is performed at an exposure side of a dual stage lithographic apparatus, while the measuring is performed at a measurement side. It is also possible to perform the measuring procedure at an entirely different apparatus with its own measure grid.

Grid setup may be performed using dedicated calibration substrates, with both the measure and expose sides being calibrated relative to a reference layer. This reference layer can warp as the wafer is clamped. As such, clamping fingerprints end up in both the measure grid and expose grid. When this content is the same between the measurement and exposure-sides, and does not change between layers, it cancels out. The reference layer (e.g., layer L1) exposes the calibration clamping fingerprint onto an already clamped wafer. On subsequent layers, wafer alignment will measure only the clamping difference compared to this calibrated fingerprint (which is also in the measurement grid), which is zero.

This situation changes when clamping content in the grid is different between layers, as may be the case when using a different machine for different layers of the same substrate (matched machine overlay), when there is significant grid drift and/or during a recovery operation (e.g., after a wafer table exchange or otherwise). The subsequent layers will have a different wafer alignment reference then the original exposure map in the first layer L1, and different subsequent exposure maps, also. Errors will be introduced when the calibration wafers clamp differently from the product wafer, which is often the case.

It is known to use a calibration wafer to monitor clamping drift update in both measurement and expose grids. This is not free of clamping error mismatch when the wafer alignment sampling and modeling does not fully capture the drift difference between product and drift control wafers. Performance loss can thus be expected for wafer specific clamping content.

In summary, because of the way it is presently determined, a clamping fingerprint or component is integral part of the grid; such a clamping fingerprint will be present in both the expose grid and measure grid. Under many conditions it cancels out and has no performance impact. However if grid content changes (drift control, scanner recovery, or matching between scanners) it causes an overlay impact. For scanner recovery after Wafer Table swap, recalibrating the scanner clamping grid results in significant recovery time. Additional to this, the scanner grid content can add time for re-calibrating production control loops. This additional time may be up to 160 hours for an average wafer table swap.

Calibration currently requires expensive machine matched calibration wafers, with a wafer error correction file being determined for each calibration wafer for calibration wafer matching (e.g., such that all calibration wafers look similar). This wafer error correction is major overhead (both monetarily and temporally) in this calibration.

After a scanner recovery, the scanner may be reset back to a 'zero' calibration error. This may be done even when the system had already drifted before the intervention, and the recovery update is not connected to any sudden system change resultant from the intervention. There is no strategy for preventing a sudden change in scanner grid content and associated change in overlay fingerprints which will hit Wafers in Process (WIP), i.e., wafers which are still to have further layers exposed upon, during such an intervention.

To address one or more of these issues, methods of performing calibrations are proposed such that substrate and protocol specific content is measured, modeled, and removed from the system grid to be calibrated. This may be implemented either by inline tooling/modeling on the scanner, or offline tooling interfacing with control loops.

In a first embodiment, it is proposed to filter out wafer specific content from the grid. Such a method may comprise determining a wafer position dependent wafer map. Such a wafer map comprises a component of the expose grid which does not change with the scanner stage expose position. The method may comprise exposing fields which are partially overlapping; measuring such fields allows for mathematical decomposition into grid-plate content and chuck deformation (stage position dependent—e.g., in terms of X, Y, and Rz where X and Y is the coordinate system in the substrate plane and the latter is rotation around the Z-axis, perpendicular to the substrate plane), and the wafer position dependent wafer map (e.g., in terms of only X and Y). It is then proposed to filter out this wafer position dependent wafer map so that it is not comprised within the expose grid. Furthermore, the wafer position dependent wafer map may be subtracted from the measure grid.

In this manner, clamping and other calibration wafer specific content is filtered from the wafer stage scanner grid (exposure and measure grids). Therefore the clamping fingerprint is taken out of the scanner grid definition. This obviates the need for wafer error correction in the grid setup (for matching calibration wafers). Alternatively, such error correction may now be limited to only a calibration for wafer alignment to metrology target offset.

Furthermore, there will be no wafer specific clamping fingerprint in scanner grid. This provides a more robust grid definition. For example, when applied to drift control, the effects of calibration wafer aging can be prevented from entering the scanner grid. Also, any crosstalk with other process control loops may be avoided, providing more reliable and stable performance and better KPIs.

Furthermore, it may be that at least some calibration tests will not be required after a wafer table swap, as the wafer clamping grid does not require any re-calibration. This improves scanner recovery time, and likely reduces complexity of recovery. Furthermore jumps may be avoided when there are changes in the grid clamping component. During wafer table recovery, these can be in the region of 5 nm, which wafer alignment can only partly correct for. Avoiding jumps can reduce the aforementioned additional time for re-calibrating production control loops after a wafer table swap.

Such a method may be more robust to thermal disturbances which affect wafer clamping during calibration protocol.

A wafer table flatness to overlay conversion model may work better between scanners, as edge roll-off and other wafer table topological effects are no longer calibrated in the grid. Such a conversion model may be used in computational metrology methods for predicting overlay based on level sensor data. Such a conversion model could then also be used as alternative to the grid wafer map, in which case this conversion map can be added to the measure and exposure grids. This may improve running matching overlay between scanners, while not using scanner actuation ranges for dedicated chuck overlay use cases.

Provided clamping repeats between systems, the clamping map determined on the expose side of one scanner could also be applied/subtracted from other tools and systems.

Currently during grid calibration, calibration wafers are physically unloaded between exposure (exposure side) and readout (measure side). Timings and wafer management (thermal loads) are therefore different between exposure and measure side readouts. In the context of clamping, it is proposed to improve measure and grid matching further by improving the consistency in the calibration protocol. This can be achieved by using a dense fine wafer alignment (FIWA) sampling on the measure side while performing exposures via lot operation. In this manner, the wafer is not physically re-clamped between the measure and expose side calibrations. A hybrid of this and the current method of separate dense readouts on measure side from the exposure can also be envisioned. In this case, a more global measure side content can be sampled from a less dense sampling of (for example approximately 100) FIWA targets during the exposure. The high frequency content, less likely to be thermal/clamping specific, can then be calibrated using a more comprehensive readout based on a few thousand marks.

As an illustration, one embodiment to determine a wafer map may comprise performing the following method so as to split calibration content to various sources, including a wafer substrate dependent map.

In a first step, a wafer may be exposed with reference metrology targets using a mask having matching targets. The metrology targets are placed in a grid with a fixed pitch in X and Y directions. Multiple exposures can now be made, with each exposure on top of the last (overlaid), or (depending on the metrology tool) exposed with a small shift such that targets are placed side-by-side and can also be measured individually with respect to each other. Fields can be exposed with shifts in X and Y direction, using multiples of the grid pitch. This can be done by moving wafer stage and/or reticle stage. This way the same location of the wafer can be exposed at different stage positions.

These metrology targets can then be measured and a model applied to decompose these measurements into separate component sources. One such model may comprise a linear model combined with a design of experiments, and additionally assumptions (if necessary) to complete any missing measured degrees of freedom. The design of experiments can vary inter alia: stage position (wafer and/or reticle), stage rotation, stage height (in case for example telecentric effects play a role), leveling data to determine non-controllable Z offsets, substrate load offsets and/or load rotations, substrates used. In addition the expose side can be used in either a scanner or a stepper mode. It might even be envisioned to use actuators such as reticle masking (ReMa) blades to vary size and position of the illumination slit at wafer level. Any system knob may be used to provide a viable degree of freedom to add to the design of experiments.

As such, the benefit of applying the wafer substrate map, determined on the expose side, to the measure grid becomes apparent. The measure side on its own might contain fewer degrees of freedom to setup an elaborate design of experiments needed to split wafer substrate from stage grid.

The above model can be enhanced with interpolation, extrapolation, and filtering techniques.

In a further embodiment, a method for avoiding WIP impact when performing recovery grid updates is proposed. Such a method comprises providing an inline or offline tool which reconstructs the grid update based on calibration data, grid update data and/or a scanner actuation model. This tool can then provide sub-recipes which effectively undo all/part of any grid updates that would result in a (negative) WIP impact. This can result in a significant reduction in recalibration time for WIP lots. Such a tool may also be used to determine new performance KPIs by separating wafer specific scanner grid content (such as the wafer position dependent wafer map) from the processing part of control loops.

The recalibration time reduction is relevant for:

Changes in grid design when upgrading a scanner in the field, and/or changes in the grid definition of what is the 'zero calibrated state'.

Scanner recovery when the system is calibrated from a drifted state back to a 'zero' state according to grid definitions. Where the recovery itself did not induce a fingerprint change that needs calibration, or it is smaller than the difference from drifted to zero calibrated state.

When calibration protocol/execution actually introduces updates which are incorrect. This can be due to execution error or systematic effects from protocol that differ from high volume manufacturing lot operation.

In a further embodiment, an improved wafer table recovery sequence is proposed. As already mentioned, removing the wafer specific clamping fingerprint would potentially eliminate the need to run certain calibration tests during wafer table recovery. However, as a wafer table swap can potentially induce an encoder block deformation, it is proposed that the encoder block shape be monitored e.g., by measuring the shape before and after the wafer table swap and therefore any change in shape. Based on the change in shape, an encoder block deformation impact on the scanner grid can be determined and fed forward into both the measure grid and expose grid. Any mention of encoder block in this section can be read more generally as an object table support, and may encompass a mirror block, depending on the type of lithographic tool used.

In an embodiment, the encoder block shape change can be measured with the Level Sensor, e.g., to determine height maps on encoder block and/or a wafer supported on a wafer table thereon. Alternatively or in addition, the encoder block shape change can be measured via measurements of wafer alignment targets on encoder block sensors (or on the encoder block itself if situated there also). Alternatively or in addition, the encoder block shape change can be measured using 3D wafer stage encoders. In addition scans of the encoder area can be used to determine encoder inconsistencies, and hence indicate encoder block deformation.

A suitable model may then be used to convert the encoder shape deformation into a grid update. The model input can be encoder block shape change and current scanner grid maps. The model can also use known scanner grid design, e.g., known encoder block deformation behavior such as quadrant-like effects and fading (e.g., observed for certain lithographic machine types).

The Z-height change caused by a wafer table swap can be combined to determine the wafer XY grid using a suitable model (e.g., which estimates X/Y data from Z data). This update can be put in the scanner measure and expose grids (inline or with offline tooling) to reduce WIP impact.

In a further embodiment, a (e.g., inline or offline) tool for predicting grid change impact on on-product overlay may be provided. This tool may take the scanner grid update (e.g., as determined using a method described above) and, combined with product recipes and corrections, can trace through all scanner steps where grid content is used. As such, a tool like this can predict correction maps to be applied to products which were started, but not finished, before the scanner grid update (WIP). These correction maps can then be applied to these WIP lots to prevent overlay performance impact.

Such a tool may be beneficial for scanner upgrades, when grid definitions are changed and/or scanner recoveries, where the grid is reset. In the latter case, a split may be made to determine which part is hardware related, and which part is only an update in the grid definition. In this case only the grid definition part needs to be fed forward into the tooling to calculate subrecipes.

The tool may also be able to update current product subrecipes to determine correction subrecipes to be used after the grid update for new lots, without the need to actually measure any new lots. This obviates the need for using send-ahead lots to re-calibrate product correction subrecipes after a scanner grid update.

All the embodiments disclosed are described in terms of particular types of lithographic apparatus comprising encoder sensors/encoder blocks etc., and therefore use encoder maps. The concepts can be applied equally to other types of apparatuses which may use mirror maps instead of encoder maps.

The proposed methods are particularly relevant for multi-stage systems comprising, for example, a measure side and expose side (such as illustrated in FIG. 1), and in particular to address the issue of part of expose side calibration being fed back into the measure grid. However, the concepts can be extended to systems where a wafer map determined on one system could be applied to other systems/chucks. In particular, such a concept may be extended to systems comprising a stand-alone alignment station and single stage scanner. In the latter case, all mentions of measure side and measure grid may relate to the stand-alone alignment station and all mentions of expose side and expose grid may relate to the single stage scanner.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

Embodiments of the present disclosure can be further described by the following clauses. 1. A method of determining an updated measure grid in a lithographic system, comprising: obtaining calibration data relating to one or more calibration substrates;

determining an exposure grid for an exposure location of the lithographic system from said calibration data;

determining a measure grid for a measure location of the lithographic system from said calibration data; and decomposing said exposure grid and said measure grid so as to remove a calibration substrate dependent component from said measure grid, resulting in the updated measure grid. 2. A method as in clause 1, wherein said calibration substrates have been exposed with partly overlapping fields, enabling said decomposing step, which decomposes a stage dependent component and the calibration substrate dependent component from each of said exposure grid and measure grid. 3. A method as in clause 2 wherein said calibration substrates have been exposed with metrology targets in a fixed grid, said metrology targets having been formed with multiple overlaid and/or adjacent exposures;

measuring said metrology targets to obtain said calibration data; and applying a model to the calibration data so as to decompose the calibration data into separate component sources. 4. A method as in clause 1, 2 or 3, comprising performing a lithographic system recovery or upgrade operation; which comprises:

reconstructing grid update data relating to at least one or more previously performed grid updates on said substrate independent exposure grid and/or said substrate independent measure grid; and using the reconstructed grid update data to reverse the effects of the at least one or more previously performed grid updates. 5. A method as in clause 4, wherein the step of using the reconstructed grid update data comprises minimizing an overlay impact of the grid updates on exposure of subsequent layers on substrates which have had layers exposed thereon prior to the recovery operation. 6. A method as in clause 4 or 5, wherein the reconstructed grid update data is determined using a lithographic system actuation model based on said calibration data and/or grid update data. 7. A method as in clause 4, 5 or 6, wherein the recovery operation comprises resetting the lithographic system from a drifted state to a zero calibrated state, wherein the exposure grid and measure grid in the zero calibrated state respectively comprise a substrate independent exposure grid and substrate independent measure grid. 8. A method as in any of clauses 4 to 7, comprising using said grid update data to trace through all steps where related grid content is used;

predicting an impact of the grid update on on-product overlay; and determining a correction based on the prediction of the impact of the grid update. 9. A method as in clause 8, comprising updating one or more current product subrecipes to determine one or more correction subrecipes for use after the grid update for new lots, without measuring the new lots. 10. A method as in any preceding clause, comprising monitoring the deformation of a substrate table support resultant from a substrate table exchange;

determining a grid impact correction resulting from the deformation; and updating the substrate independent exposure grid and substrate independent measure grid with the grid impact correction. 11. A method as in clause 10, wherein monitoring the deformation of a substrate table support comprises measuring the shape of the substrate table support before and after the substrate table exchange.

12. A method as in any preceding clause, comprising performing a calibration to determine the calibration data. 13. A method as in clause 12, wherein the calibration is performed without physically re-clamping the calibration substrate between performance of a measure side calibration to determine said measure grid and an expose side calibration to determine said exposure grid. 14. A computer program comprising program instructions operable to perform the method of any preceding clause, when run on a suitable apparatus. 15. A non-transient computer program carrier comprising the computer program of clause 14. 16. A processing system comprising a processor and a storage device comprising the computer program of clause 15. 17. A lithographic system comprising the processing system of clause 16.

The breadth and scope of the present invention should not be limited by any of the above-described exemplary embodiments, but should be defined only in accordance with the following claims and their equivalents.

The invention claimed is:

1. A method of determining an updated measure grid in a lithographic system, comprising:

obtaining calibration data relating to one or more calibration substrates;

determining an exposure grid for an exposure location of the lithographic system from the calibration data;

determining a measure grid for a measure location of the lithographic system from the calibration data; and decomposing the exposure grid and the measure grid so as to remove a calibration substrate dependent component from the measure grid, resulting in the updated measure grid, wherein the calibration substrates have been exposed with partly overlapping fields, enabling the decomposing step that decomposes a stage dependent component and the calibration substrate dependent component from each of the exposure grid and measure grid.

2. The method of claim 1, wherein the calibration substrates have been exposed with metrology targets in a fixed grid, the metrology targets having been formed with multiple overlaid and/or adjacent exposures;

measuring the metrology targets to obtain the calibration data; and applying a model to the calibration data so as to decompose the calibration data into separate component sources.

3. The method of claim 1, comprising performing a lithographic system recovery or upgrade operation that comprises:

reconstructing grid update data relating to at least one or more previously performed grid updates on a substrate independent exposure grid and/or a substrate independent measure grid; and using the reconstructed grid update data to reverse the effects of the at least one or more previously performed grid updates.

4. The method of claim 3, wherein the step of using the reconstructed grid update data comprises minimizing an overlay impact of the grid updates on exposure of subsequent layers on substrates that have had layers exposed thereon prior to the recovery operation.

5. The method of claim 3, wherein the reconstructed grid update data is determined using a lithographic system actuation model based on the calibration data and/or grid update data.

6. The method of claim 3, wherein the recovery operation comprises resetting the lithographic system from a drifted state to a zero calibrated state, wherein the exposure grid and measure grid in the zero calibrated state respectively comprise a substrate independent exposure grid and substrate independent measure grid.

7. The method of claim 3, comprising:

using the reconstructed grid update data to trace through all steps where related grid content is used;

predicting an impact of the grid update on on-product overlay; and determining a correction based on the prediction of the impact of the grid update.

8. The method of claim 7, comprising updating one or more current product subrecipes to determine one or more correction subrecipes for use after the grid update for new lots, without measuring the new lots.

9. The method of claim 1, comprising monitoring deformation of a substrate table support resultant from a substrate table exchange;

determining a grid impact correction resulting from the deformation; and updating a substrate independent exposure grid and substrate independent measure grid with the grid impact correction.

10. The method of claim 9, wherein monitoring the deformation of the substrate table support comprises measuring the shape of the substrate table support before and after the substrate table exchange.

11. The method of claim 1, comprising performing a calibration to determine the calibration data.

12. The method of claim 11, wherein the calibration is performed without physically re-clamping the calibration substrate between performance of a measure side calibration to determine the measure grid, and an expose side calibration to determine the exposure grid.

13. A computer program comprising program instructions operable to perform the method of claim 1, when run on a suitable apparatus.

14. A non-transient computer program carrier comprising the computer program of claim 13.

15. A processing system comprising a processor and a storage device comprising the computer program of claim 14.

16. A lithographic system comprising the processing system of claim 15.

* * * * *